US009728742B2

(12) United States Patent
Lee et al.

(10) Patent No.: US 9,728,742 B2
(45) Date of Patent: Aug. 8, 2017

(54) DISPLAY PANEL ASSEMBLY AND METHOD OF MANUFACTURING A DISPLAY PANEL THEREFROM

(71) Applicant: Samsung Display Co., Ltd., Yongin-si, Gyeonggi-do (KR)

(72) Inventors: Hyun Wook Lee, Busan (KR); Ju Yong Park, Asan-si (KR); Jung Chul Woo, Seoul (KR); Jun-Hee Lee, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/050,523

(22) Filed: Feb. 23, 2016

(65) Prior Publication Data
US 2017/0003527 A1 Jan. 5, 2017

(30) Foreign Application Priority Data
Jul. 3, 2015 (KR) .......................... 10-2015-0095181

(51) Int. Cl.
*H01L 23/48* (2006.01)
*H01L 21/00* (2006.01)
*H01L 51/52* (2006.01)
*G02F 1/1339* (2006.01)

(52) U.S. Cl.
CPC ........ *H01L 51/5246* (2013.01); *G02F 1/1339* (2013.01)

(58) Field of Classification Search
CPC .................................................. H01L 51/5246
USPC .......................... 257/686–688; 438/109–118
See application file for complete search history.

(56) References Cited

U.S. PATENT DOCUMENTS

| 7,253,867 B2* | 8/2007 | Kim | G02F 1/1339 349/54 |
| 7,714,951 B2* | 5/2010 | Kim | G02F 1/1339 349/153 |
| 8,203,685 B2* | 6/2012 | Jung | G02F 1/1339 349/153 |

FOREIGN PATENT DOCUMENTS

| KR | 1020120018978 A | 3/2012 |
| KR | 1020120076987 A | 7/2012 |
| KR | 1020130000656 A | 1/2013 |
| KR | 1020140077021 A | 6/2014 |

* cited by examiner

*Primary Examiner* — Calvin Lee
(74) *Attorney, Agent, or Firm* — Cantor Colburn LLP

(57) ABSTRACT

A display panel assembly according to an exemplary embodiment of the present disclosure includes: an upper mother substrate; a lower mother substrate disposed opposing the upper mother substrate and including a plurality of thin film transistor (TFT) arrays; a sealing member formed between the upper mother substrate and the lower mother substrate and formed with a closed loop shape to surround the thin film transistor array; and a seal pattern formed on an edge region of the upper mother substrate and the lower mother substrate to bond the upper mother substrate and the lower mother substrate and in which an open region is formed to connect the inside and outside of the bonded upper mother substrate and lower mother substrate.

14 Claims, 6 Drawing Sheets

DISPLAY PANEL ASSEMBLY AND METHOD OF MANUFACTURING A DISPLAY PANEL THEREFROM

This application claims priority to Korean Patent Application No. 10-2015-0095181 filed on Jul. 3, 2015, and all the benefits accruing therefrom under 35 U.S.C. §119, the contents of which in their entirety are herein incorporated by reference.

BACKGROUND

1. Field

The invention relates to a display panel assembly and a method of manufacturing a display panel therefrom, and particularly, to a display panel assembly having a structure in which upper and lower mother substrates are bonded by a seal pattern and a method of manufacturing a display panel therefrom.

2. Description of the Related Art

Flat panel displays include a liquid crystal display ("LCD") panel, a plasma display panel ("PDP"), an organic light emitting diode ("OLED") device, an electric field effect display ("FED") device, an electrophoretic display device, etc.

Particularly, the liquid crystal display ("LCD") panel includes a thin film transistor ("TFT") substrate and a color filter substrate bonded to each other such as by an adhesive, with a liquid crystal layer including liquid crystals between the two substrates. The thin film transistor substrate includes a plurality of the thin film transistor arrays, and the color filter substrate includes a plurality of color filter arrays.

SUMMARY

One or more exemplary embodiment of the present disclosure provides a display panel assembly including a seal pattern at an edge region between mother substrates and in which an open region thereof is defined, the open region connecting inner and outer areas of the display panel assembly, and a method of manufacturing a display panel from the display panel assembly.

An exemplary embodiment of a display panel assembly includes: an upper mother substrate; a lower mother substrate disposed opposing the upper mother substrate and including a thin film transistor array provided in plural; a sealing member having a closed loop shape provided in plural between the upper mother substrate and the lower mother substrate and respectively surrounding the thin film transistor arrays; and a seal pattern which is at an edge region of the upper mother substrate and the lower mother substrate and bonds the upper mother substrate and the lower mother substrate to each other to define an inner area within the seal pattern and an outer area outside the seal pattern. The seal pattern defines an open region thereof which connects the inner and outer areas to each other.

At the open region, the seal pattern may define an overlapping double-wall shape.

At the open region, the overlapping double-wall shape of the seal pattern may be defined by a plurality of bent portions thereof.

With respect to an edge of the upper or lower mother substrate, the plurality of bent portions may include vertically bent portions.

With respect to an edge of the upper or lower mother substrate, the plurality of bent portions may include obliquely bent portions.

At a region adjacent to the open region, the seal pattern may extend to define an overlapping double-wall shape.

The open region may be defined at a corner region of the bonded upper mother substrate and lower mother substrate.

The open region may be defined at a side edge region of the bonded upper mother substrate and lower mother substrate.

In a top plan view at the open region, the sealing pattern may define a penetration hole extended from the outer area to the inner area and a cross-section of the penetration hole may become larger toward the inner area from the outer area.

The seal pattern may include a frit or resin.

The upper mother substrate may include a color filter array provided in plural and respectively corresponding to the thin film transistor arrays.

An exemplary embodiment of a method of manufacturing a display panel includes: preparing an upper mother substrate of a display panel assembly from which the display panel is formed; preparing a lower mother substrate of the display panel assembly to be disposed opposing to the upper mother substrate by forming a thin film transistor array in plural on the lower mother substrate, the thin film transistor array corresponding to the display panel; forming a sealing member having a closed loop shape in plural on one of the upper mother substrate and the lower mother substrate and respectively surrounding the thin film transistor arrays; forming a seal pattern which is at an edge region of one of the upper mother substrate and the lower mother substrate to define an inner area within the seal pattern and an outer area outside the seal pattern, the seal pattern defining an open region thereof which connects the inner and outer areas to each other; forming a plurality of unit display panels by bonding the upper mother substrate and the lower mother substrate to each other with the sealing member and the seal pattern disposed therebetween; hardening the sealing member and the seal pattern; etching the bonded upper mother substrate and lower mother substrate; and scribing the bonded upper mother substrate and lower mother substrate to separate the plurality of unit display panels from each other and form the display panel in plural.

The forming the sealing member and the seal pattern may include a dispensing method or a screen printing method.

The forming the seal pattern may define an overlapping double-wall shape at the open region.

At the open region, the overlapping double-wall shape of the seal pattern may defined by a plurality of bent portions thereof.

In a top plan view of the open region, the seal pattern may define a penetration hole extended from the outer area to the inner area, and a cross section of the penetration hole may become larger toward the inner area from the outer area.

The sealing member surrounding the thin film transistor array may define an array region of the display panel assembly, the preparing the upper mother substrate may include forming a color filter array in plural and corresponding to the thin film transistor array. After forming the seal pattern, the method may include dripping liquid crystal on the array region.

According to one or more exemplary embodiment, internal pressure between the mother substrates may be maintained such that the cell gap therebetween may be easily maintained, and internal penetration of a chemical liquid into the space between the mother substrates may be reduced or effectively prevented.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
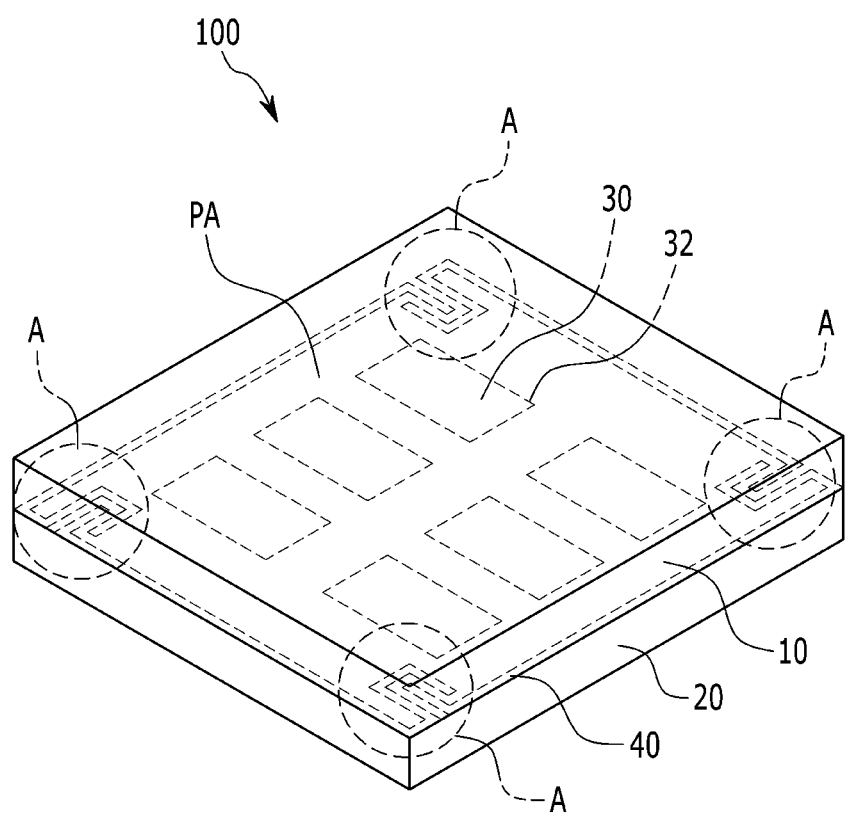
FIG. 1 is a perspective view schematically illustrating an exemplary embodiment of a display panel assembly according to the invention.

Hereinafter, the invention will be described more fully with reference to the accompanying drawings, in which exemplary embodiments of the invention are shown. As those skilled in the art would realize, the described embodiments may be modified in various different ways, all without departing from the spirit or scope of the invention.

Further, in exemplary embodiments, since like reference numerals designate like elements having the same configuration, an exemplary embodiment is representatively described, and in other exemplary embodiments, only different configurations from the exemplary embodiment will be described.

It is to be noted that the accompanying drawings are schematically illustrated and are not illustrated to scale. A relative dimensions and ratios of components are illustrated being exaggerated or reduced in the drawings for clarity and convenience in the drawings, and dimensions are only examples and therefore are not limited thereto. Further, the same structures, elements, or parts which are illustrated in at least two drawings are denoted by the same reference numerals, which are used to indicate similar features.

The mention that any portion is present "over" or "on" another portion means that the portion may be directly formed on the other portion or a third portion may be interposed between the portion and the other portion. When a portion is referred to as being "directly over" or "directly on" another portion, there are no intervening portions present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one elements relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

An exemplary embodiment will now be described in detail. Herein, numerous variations of exemplary embodiments are expected. Therefore, the exemplary embodiments are not limited to a specific form of the illustrated regions and for example, also include a form that is changed by manufacturing.

In manufacturing a display panel, each of a plurality of thin film transistor arrays of a thin film transistor substrate and each of a plurality of color filter arrays of a color filter substrate corresponds to a unit display panel among multiple unit display panels of a display panel assembly formed during a manufacturing process. The adhesive which bonds two substrates to each other includes a sealing member having with a closed loop shape surrounding each of the unit display panels, and a seal pattern disposed at an edge region of the thin film transistor substrate and the color filter substrate. Additionally, the adhesive may bond the color filter substrate and the thin film transistor substrate to each other, and maintain a cell gap of the liquid crystal layer. Particularly, the seal pattern may reduce or effectively prevent internal penetration of a chemical liquid during the manufacturing process of the display panel.

Generally, the seal pattern may be disposed as a closed structure to reduce or effectively prevent chemical liquid from penetrating. Where the seal pattern has the closed structure, since the thin film transistor substrate and the color filter substrate are bonded to each other in a vacuum state, the space between the substrates is in a vacuum state, and distortion of a cell gap and spot defects are undesirably generated due to relatively strong air pressure.

To solve this problem, where the seal pattern is disposed to have an open structure, the space between the substrates is not in a vacuum state and air may leak and flow thereinto, so the above-described problem is not generated. However, during the manufacturing process of the display panel (particularly, an etching process), internal penetration of a chemical liquid (etchant) generates erosion and corrosion.

Figure 2:
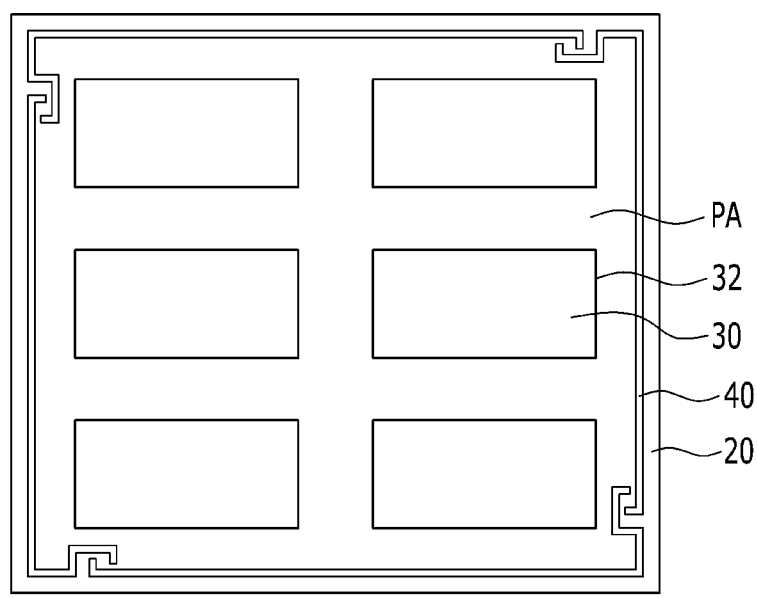
FIG. 2 is a top plan view schematically illustrating an exemplary embodiment of a sealing member relative to a seal pattern of a display panel assembly according to the invention.
Figure 3:
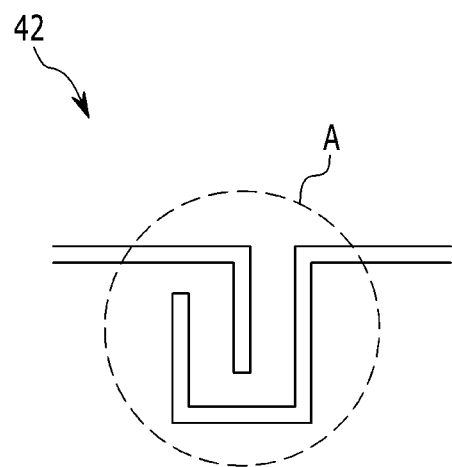
FIG. 3 is a top plan view schematically illustrating an exemplary embodiment of a shape of a seal pattern according to the invention.

Hereinafter, a display panel assembly according to the invention will be described with reference to FIGS. 1 to 3. Referring to FIG. 1 to FIG. 3, a liquid crystal display panel is illustrated, however exemplary embodiments are not limited to the liquid crystal display panel, and may be applied to an organic light emitting display panel and the like without limitation.

FIG. 1 is a perspective view schematically illustrating an exemplary embodiment of a display panel assembly according to the invention, FIG. 2 is a top plan view schematically illustrating an exemplary embodiment of a sealing member relative to a seal pattern of a display panel assembly according to the invention, and FIG. 3 is a diagram schematically illustrating an exemplary embodiment of a shape of a seal pattern according to the invention.

Referring to FIG. 1, a display panel assembly 100 from which a plurality of unit display panels 30 is formed includes an upper mother substrate 10 and a lower mother substrate 20 which is disposed opposing the upper mother substrate 10.

The upper mother substrate 10 includes a plurality of color filter arrays therein. A color filter array of the upper mother substrate 10 includes a black matrix for reducing or effectively preventing light leakage, a color filter for color expression, a common electrode which forms a vertical electric field with a pixel electrode, and an upper alignment layer for liquid crystal alignment each provided in plural in the upper mother substrate 10.

The lower mother substrate 20 includes a plurality of thin film transistor arrays therein. A thin film transistor array of the lower mother substrate 20 includes a gate line and data line which are disposed to intersect each other, a thin film transistor respectively connected to the gate line and the data line, a pixel electrode which is connected to the thin film transistor, and an lower alignment layer for liquid crystal alignment each provided in plural in the lower mother substrate 20.

The display panel assembly 100 includes a sealing member 32 provided in plural between the upper mother substrate 10 and the lower mother substrate 20 and disposed to have a closed loop shape respectively surrounding a color filter array corresponding to a thin film transistor array.

In addition, the display panel assembly 100 includes a seal pattern 40 provided in plural at an edge region of the display panel assembly 100 between the upper mother substrate 10 and the lower mother substrate 20 to bond the upper mother substrate 10 and lower mother substrate 20 together. An inner area of the display panel assembly 100 (or the mother substrates) is defined within an overall boundary of the seal pattern 40 such as where the sealing members 32 are disposed. An outer area of the display panel assembly 100 is defined outside of the overall boundary of the seal pattern 40 such as where edges of the upper mother substrate 10 and the lower mother substrate 20 are disposed. The seal patterns 40 define an open region A at which the inner area and the outer area are connected to each other of the upper mother substrate 10 and the lower mother substrate 20.

As illustrated in FIG. 1 and FIG. 2, the collection of seal patterns 40 does not form a closed loop shape different from a shape of the sealing member 32. An overall seal pattern member may be defined by a plurality of seal patterns 40 each having a straight line shape at an edge region of the mother substrates 10 and 20. Adjacent seal patterns 40 which extend along adjacent edge portions may define an overlapping shape at a corner portion of the mother substrates 10 and 20.

The adjacent seal patterns 40 may be disposed to form a partially overlapping double-wall shape at the open region A. The double-wall shape is defined by portions of adjacent seal patterns 40 disposed sequentially from an outer edge of the upper and/or lower mother substrate 10 and 20. A length of the seal pattern 40 may be extended along an edge region of the display panel assembly 100. One or both ends of the length of the seal pattern 40 may have a shape defined by a plurality of bent portions at the open region A.

The straight line portion of the seal pattern 40 may extend substantially parallel to an outer edge of the upper and/or lower mother substrate 10 and 20. Bent portions of the seal pattern 40 are defined by portions of the straight line portion inclined with respect to the outer edge of the upper and/or lower mother substrate 10 and 20 or the straight line portion.

A plurality of seal patterns 42 of which distal ends thereof are adjacent overlap may be defined by a bent portion elongated vertical (e.g., perpendicular) relative to a length direction of the straight line portion thereof, as illustrated in FIG. 3. One seal pattern 42 may include only one first vertical bent portion and the other seal pattern 42 may include two second vertical bent portions, where the first vertical bent portion is disposed between the two second vertical bent portions. That is, the plurality of the seal patterns 42 at the open region A may be defined by overlapping lines which are bent one time and three times, respectively. A distal end portion of each seal pattern 42 is inclined relative to a length direction of the straight line portion thereof, but the invention is not limited thereto.

The seal pattern 40 may include a frit or hardening resin, and the hardening resin may include a resin series such as cycloaliphatic epoxide, an epoxy acrylate, and a vinyl epoxy resin. In an exemplary embodiment of manufacturing a display panel assembly 100, when the upper mother substrate 10 and the lower mother substrate 20 are etched by an etchant including hydrogen fluoride (HF), the epoxy series resin of the seal pattern 40 is suitable as an etching protection material.

In FIG. 1 and FIG. 2, although the open region A is defined at a corner region of the mother substrate 10 and the lower mother substrate 20 where adjacent outer edges thereof meet, the invention is not limited thereto. A single one of the open region A may be defined at a side region of the mother substrate 10 and the lower mother substrate 20 between opposing corner regions thereof, or multiple open regions A may be defined at a same side region.

Figure 4:
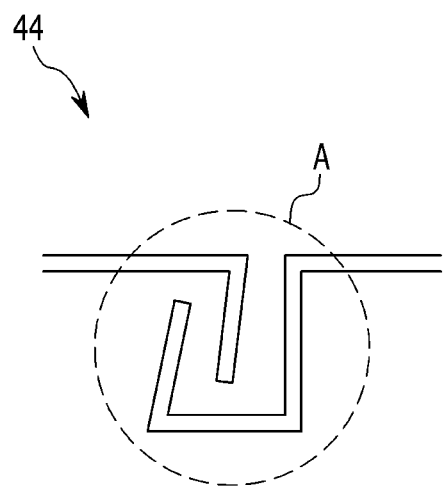
FIG. 4 is a top plan view schematically illustrating a modified exemplary embodiment of a shape of the seal pattern in FIG. 3 according to the invention.

FIG. 4 is a top plan view schematically illustrating a modified exemplary embodiment of a shape of the seal pattern in FIG. 3 according to the invention. As illustrated in FIG. 4, a plurality of seal patterns 44 of which distal ends thereof are adjacent overlap may be defined by a bent portion elongated obliquely (e.g., non-vertical) relative to a length direction of the straight line portion thereof. One seal pattern 44 may include only one first obliquely bent portion and the other seal pattern 44 may include one second obliquely bent portion and one second vertical bent portion, where the first obliquely bent portion is disposed between the second obliquely and vertical bent portions. A distal end portion of each seal pattern 44 is inclined relative to a length direction of the straight line portion thereof, but the invention is not limited thereto.

The adjacent seal patterns 44 may be disposed to form a partially overlapping double-wall shape at the open region A, like the seal pattern 42 in FIG. 3. By forming the seal patterns 44 defined by obliquely bent portions, penetration of a chemical liquid to the inside of the mother substrates 10 and 20 may be reduced or effectively prevented. With the obliquely bent portions, in a top plan view, a cross-section of a penetration hole through which the inside and outside of the mother substrates 10 and 20 are connected may become larger toward the inside from the outside.

Figure 5:
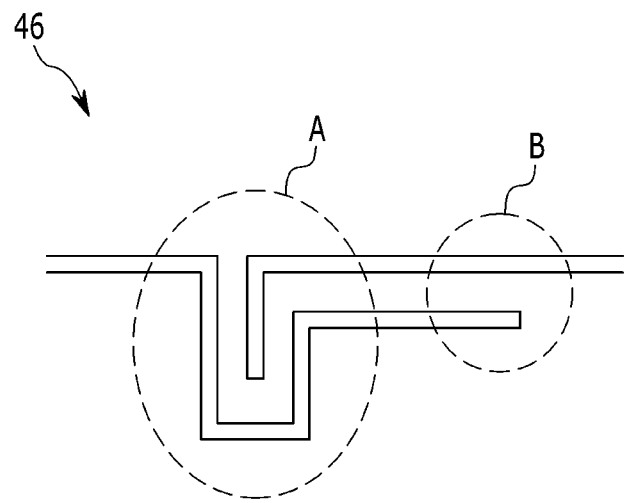
FIG. 5 is a diagram schematically illustrating another exemplary embodiment of a shape of a seal pattern according to the invention.
Figure 6:
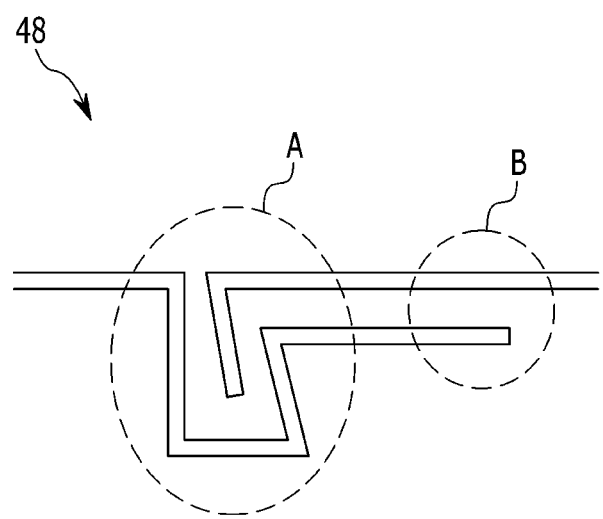
FIG. 6 is a diagram schematically illustrating a modified exemplary embodiment of a shape of the seal pattern in FIG. 5 according to the invention.

FIG. 5 is a top plan view schematically illustrating another exemplary embodiment of a shape of a seal pattern according to the invention, and FIG. 6 is a diagram schematically illustrating a modified exemplary embodiment of a shape of the seal pattern of FIG. 5 according to the invention.

As illustrated in FIG. 5, a plurality of seal patterns 46 of which distal ends thereof are adjacent overlap may be defined by a bent portion elongated vertical and parallel relative to a length direction of the straight line portion thereof. One seal pattern 46 may include only one first vertical bent portion. The other seal pattern 46 may include two second vertical bent portions and two second parallel bent portions alternated with each other. The first vertical bent portion is disposed between the two second vertical bent portions. At a region B adjacent to the open region A, a partially overlapping double-wall shape defined by the seal patterns 46. A distal end portion of one seal pattern 46 is parallel relative to a length direction of the straight line portion thereof to define the double-wall shape, different from the distal end portions in FIGS. 3 and 4.

That is, the plurality of seal patterns 46 at the open region A may be defined by overlapping lines which are bent one time and four times, respectively. As illustrated in FIG. 6, a seal pattern 48 may be defined with obliquely bent lines among overlapping lines which are bent one time and four times, respectively.

Figure 7:
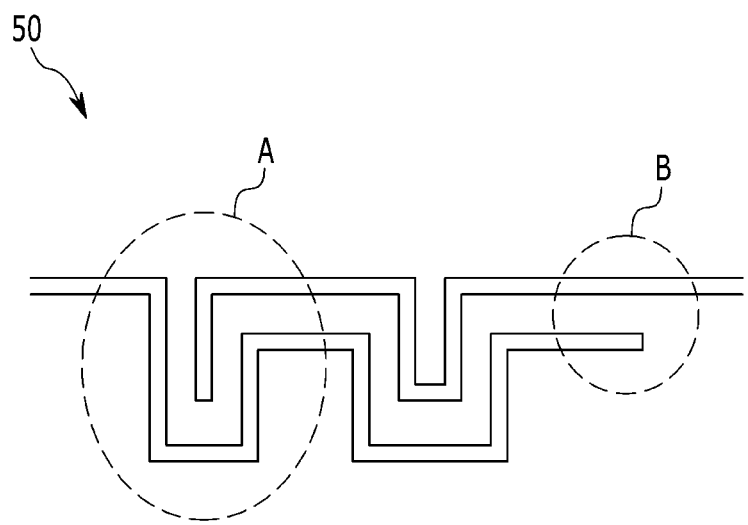
FIG. 7 is a diagram schematically illustrating still another exemplary embodiment of a shape of a seal pattern according to the invention.

FIG. 7 is a diagram schematically illustrating still another exemplary embodiment of a shape of a seal pattern according to the invention. As illustrated in FIG. 7, a plurality of seal patterns 50 may be defined by a plurality of overlapping lines. At a region B adjacent to the open region A, a partially overlapping double-wall shape defined by the seal patterns 50. A distal end portion of one seal pattern 50 is parallel relative to a length direction of the straight line portion thereof to define the double-wall shape at the region B.

In the exemplary embodiment, the seal patterns 50 are defined by overlapping lines that are bent 5 times and 8 times, respectively, but the number of times is not limited thereto. The greater the number of bends, the greater the improvement effect of reducing or effectively preventing the chemical liquid from penetrating into the space between the mother substrates 10 and 20.

Figure 8:
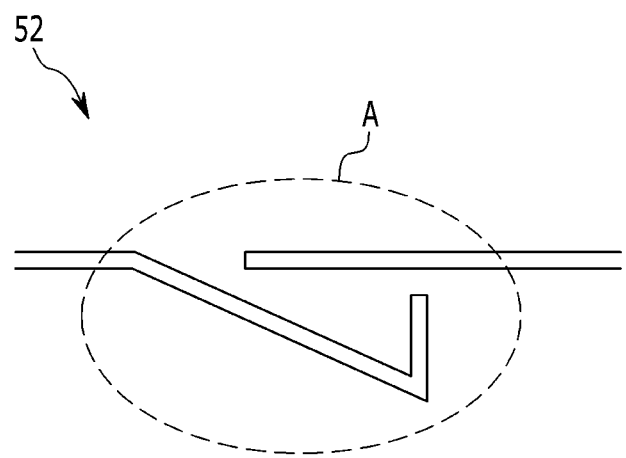
FIG. 8 is a diagram schematically illustrating yet another exemplary embodiment of a shape of a seal pattern according to the invention.

FIG. 8 is a diagram schematically illustrating yet another exemplary embodiment of a shape of a seal pattern according to the invention. As illustrated in FIG. 8, a plurality of seal patterns 52 may be formed such that only one seal pattern 52 has a bent end portion, such as being obliquely bent. Also, a distal end protrusion may be extended from the obliquely bent portion. By forming the protrusion, penetration of a chemical liquid to the inside of the mother substrates 10 and 20 may be reduced or effectively prevented.

Figure 9:
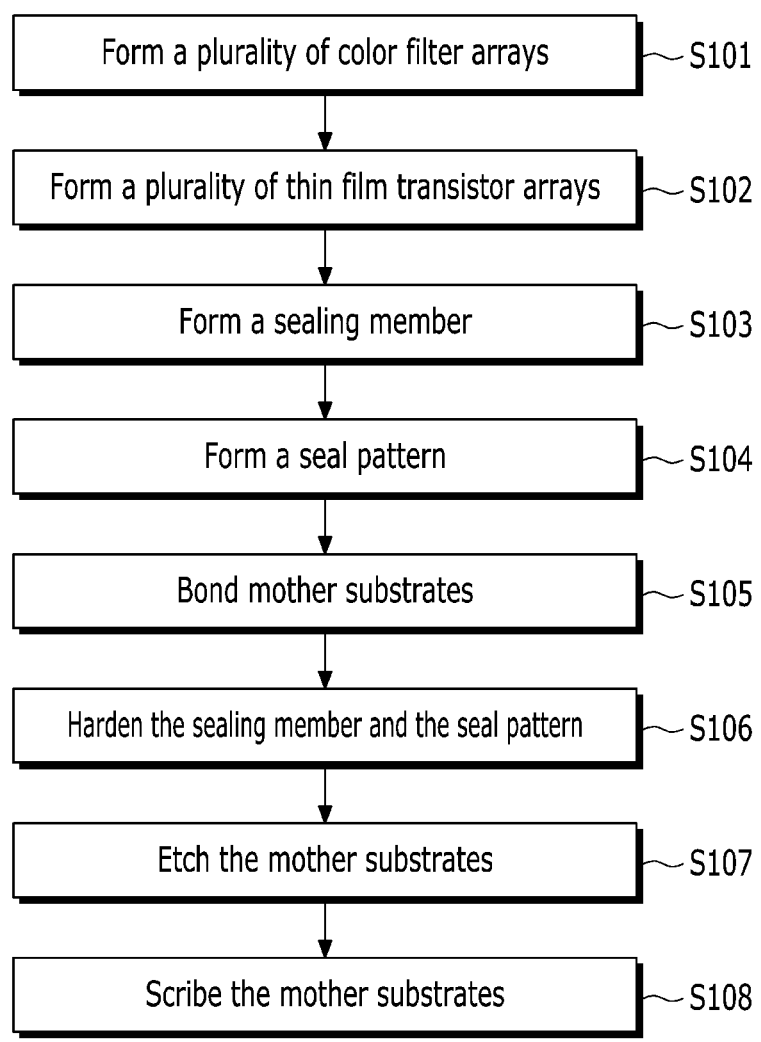
FIG. 9 is a flowchart of an exemplary embodiment of a method of manufacturing a display panel according to the invention.

FIG. 9 is a flowchart of an exemplary embodiment of a method of manufacturing the display panel according to the invention.

Referring to FIG. 9 with FIG. 1 as previously described, a method of manufacturing a display panel according the invention includes preparing an upper mother substrate 10 such as by forming a plurality of color filter arrays in the upper mother substrate (S101). Each of the color filter arrays includes a black matrix for reducing or effectively preventing light leakage, a color filter for color expression, a common electrode which forms a vertical electric field with a pixel electrode, and an upper alignment layer for liquid crystal alignment each provided in plural.

After that, a plurality of thin film transistor arrays are formed in a lower mother 20 substrate disposed opposing the upper mother substrate 10 (S102). Each of the thin film transistor arrays includes a gate line and a data line which are formed to intersect each other, a thin film transistor which is connected to the gate line and the data line, a pixel electrode which is connected to the thin film transistor, and a lower alignment layer for liquid crystal alignment each provided in plural.

A closed-shape sealing member 32 is formed in plural on one of the upper mother substrate and the lower mother substrate 10 to respectively surround a region of the plurality of thin film transistor arrays (S103). The sealing member 32 may be formed by a dispensing method which discharges an adhesive with a constant pressure or by a screen printing method. By forming the sealing member 32 to surround the outside of the unit display panel 30 including each of the color filter arrays and thin film transistor arrays, a gap between adjacent unit display panels 30 is maintained.

An open-shape overall seal pattern 40 is formed on an edge region of one of the upper mother substrate 10 and the lower mother substrate 20. An open region A is defined in the overall seal pattern 40 to connect the inside and outside of the upper mother substrate 10 and the lower mother substrate 20 (S104). The overall seal pattern 40 may also be formed by a dispensing method or a screen printing method, like the sealing members 32 described above.

The overall seal pattern 40 is formed to surround the outer portion of the mother substrates 10 and 20, such that during an etching process of the mother substrates 10 and 20, damage by an etchant and internal penetration of the etchant to the inside of the display panel assembly is reduced or effectively prevented.

The overall seal pattern 40 may be formed with a partially overlapping double-wall shape and the wall shape may be defined with a plurality of bent portions at the open region A. The overall seal pattern 40 may be formed with a shape of obliquely bent lines, such that after bonding of the upper mother substrate 10 and the lower mother substrate 20, a cross-section in the top plan view of a penetration hole through which the inside and outside of the mother substrate are connected may become larger toward the inside from the outside at the open region A.

Liquid crystal is disposed into an array region formed at the sealing member 32, and the upper mother substrate 10 and the lower mother substrate 20 are bonded to each other to form a plurality of unit display panels 30 (S105). The sealing member 32 is formed to surround the region of the plurality of arrays on one of the upper mother substrate 10 and the lower mother substrate 20, the liquid crystal is dripped into a liquid crystal space which is formed by the sealing member 32, and a plurality of unit display panels 30 are formed by bonding the upper mother substrate 10 and the lower mother substrate 20 together. The liquid crystal layer may be formed by a liquid crystal dripping method or a liquid crystal injecting method.

With the plurality of unit display panels 30 formed, the sealing member 32 and the seal pattern 40 are hardened (S106). The sealing member 32 and the seal pattern 40 may be hardened by an ultraviolet ("UV") hardening method or a thermal hardening method.

The bonded upper mother substrate 10 and lower mother substrate 20 are then etched (S107). The etching process forms surfaces of the upper mother substrate 10 and the lower mother substrate 20 to be flexible and relatively thin. The mother substrates 10 and 20 may be etched by a spray method in which an etchant is discharged to the rear of the mother substrates 10 and 20 or a dipping method in which the bonded upper mother substrate 10 and lower mother substrate 20 are dipped in an etchant. Penetration of etchant into the mother substrates 10 and 20 is reduced or effectively prevented during the rear etching process by the open-shape seal pattern 40 which is formed to surround the outside of the upper mother substrate 10 and the lower mother substrate 20.

The bonded upper mother substrate 10 and lower mother substrate 20 are scribed to be separated based on the plurality of unit display panels 30 (S108). In the scribing process (S108), the plurality of unit display panels 30 within the collective display panel assembly 100 are separated from each other such as by a diamond wheel according to scribing lines disposed in a peripheral area PA of the unit display panels 30. Non-uniform side surfaces of the separated unit display panels 30 may be made uniform such as by a grinding process using a grinding apparatus.

The method of manufacturing the display panel is explained considering a structure of a liquid crystal display panel, however the method is not limited thereto. In an exemplary embodiment, manufacturing a display panel may be performed considering a structure of an organic light emitting diode display panel.

As described above, according to one or more exemplary embodiment, where the display panel assembly includes the structure in which the upper mother substrate and the lower mother substrate are bonded by a seal pattern having an open region, in a method of manufacturing the display panel, internal pressure between the mother substrates is maintained such that the cell gap therebetween may be easily maintained and internal penetration of a chemical liquid into the space between the mother substrates is reduced or effectively prevented.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display panel assembly from which a plurality of unit display panels is formed, comprising:
an upper mother substrate;
a lower mother substrate disposed opposing the upper mother substrate and including a thin film transistor array provided in plural;
a sealing member having a closed loop shape provided in plural between the upper mother substrate and the lower mother substrate and respectively surrounding the thin film transistor arrays; and
a seal pattern which is at an edge region of the upper mother substrate and the lower mother substrate and bonds the upper mother substrate and the lower mother substrate to each other,
wherein in a top plan view,
the seal pattern commonly surrounds each of the sealing members having the closed loop shape and the thin film transistor arrays respectively surrounded thereby to define an inner area within the seal pattern at which the sealing members and thin film transistor arrays are disposed and an outer area outside the seal pattern, and
the seal pattern comprises an open region thereof at which the inner and outer areas are connected to each other.

2. The display panel assembly of claim 1, wherein at a region adjacent to the open region, the seal pattern extends to define an overlapping double-wall shape.

3. The display panel assembly of claim 1, wherein the open region is defined at a corner region of the bonded upper mother substrate and lower mother substrate.

4. The display panel assembly of claim 1, wherein the open region is defined at a side edge region between opposing corner regions of the bonded upper mother substrate and lower mother substrate.

5. The display panel assembly of claim 1, wherein, in the top plan view at the open region,
the sealing pattern comprises a penetration hole extended from the outer area to the inner area and at which the inner and outer areas are connected to each other, and
a cross-section of the penetration hole becomes larger toward the inner area from the outer area.

6. The display panel assembly of claim 1, wherein the seal pattern includes a frit or a resin.

7. The display panel assembly of claim 1, wherein the upper mother substrate includes a color filter array provided in plural respectively corresponding to the thin film transistor arrays.

8. The display panel assembly of claim 1, wherein the seal pattern which commonly surrounds each of the sealing members and the thin film transistor arrays is formed by a seal pattern portion provided in plurality disconnected from each other at the open region of the seal pattern and arranged to commonly surround each of the sealing members having the closed loop shape and the thin film transistor arrays respectively surrounded thereby.

9. The display panel assembly of claim 8, wherein for each seal pattern portion of the seal pattern commonly surrounding each of the sealing members and the thin film transistor arrays,
a length of the seal pattern portion extends along a length of an edge of the upper or lower mother substrate at the edge region thereof, and
each seal pattern portion includes distal ends thereof disposed at opposing ends of the length thereof,
wherein for two seal pattern portions adjacent to each other along the length of the edge of the upper or lower mother substrate, a first distal end of one seal pattern portion is disconnected from a distal end of the other seal pattern portion at the open region at which the inner and outer areas of the seal pattern are connected to each other.

10. The display panel assembly of claim 8, wherein at the open region at which the first and second distal ends are disconnected from each other, the two seal pattern portions adjacent to each other along the length of the edge of the upper or lower mother substrate are disposed overlapping each other in a direction vertical from the edge.

11. The display panel assembly of claim 1, wherein, at the open region, the seal pattern defines an overlapping double-wall shape.

12. The display panel assembly of claim 11, wherein, at the open region, the overlapping double-wall shape of the seal pattern is defined by a plurality of bent portions thereof.

13. The display panel assembly of claim 12, wherein with respect to an edge of the upper or lower mother substrate, the plurality of bent portions comprises vertically bent portions.

14. The display panel assembly of claim 12, wherein with respect to an edge of the upper or lower mother substrate, the plurality of bent portions comprises obliquely bent portions.

* * * * *